United States Patent [19]

Aina et al.

[11] Patent Number: 4,662,060
[45] Date of Patent: May 5, 1987

[54] METHOD OF FABRICATING SEMICONDUCTOR DEVICE HAVING LOW RESISTANCE NON-ALLOYED CONTACT LAYER

[75] Inventors: Olaleye A. Aina; Amir A. Lakhani, both of Columbia, Md.

[73] Assignee: Allied Corporation, Morristown, N.J.

[21] Appl. No.: 808,916

[22] Filed: Dec. 13, 1985

[51] Int. Cl.$^4$ .................. H01L 21/283; H01L 7/54
[52] U.S. Cl. .................. 29/571; 29/576 B; 29/590; 148/1.5; 148/175; 148/187; 148/DIG. 140; 357/61; 357/65; 357/91
[58] Field of Search .............. 29/571, 576 B, 590; 148/1.5, 175, 187; 357/61, 65, 91

[56] References Cited

U.S. PATENT DOCUMENTS

| | | | |
|---|---|---|---|
| 3,914,784 | 10/1975 | Hunsperger et al. | 357/61 |
| 4,263,605 | 4/1981 | Christou et al. | 357/65 |
| 4,280,854 | 7/1981 | Shibata et al. | 148/1.5 |
| 4,312,681 | 1/1982 | Rupprecht | 148/1.5 |
| 4,385,938 | 5/1983 | Park et al. | 148/1.5 |
| 4,398,963 | 8/1983 | Stall et al. | 148/1.5 |
| 4,404,732 | 9/1983 | Andrade | 29/571 |
| 4,406,052 | 9/1983 | Cogan | 29/576 B |
| 4,421,577 | 12/1983 | Spicer | 148/187 |
| 4,426,767 | 1/1984 | Swanson et al. | 29/571 |
| 4,470,192 | 9/1984 | Miller | 29/576 B |
| 4,505,023 | 3/1985 | Tseng et al. | 29/571 |
| 4,540,446 | 9/1985 | Nonaka et al. | 148/1.5 |
| 4,557,693 | 12/1985 | Kamei | 29/571 |
| 4,570,324 | 2/1986 | Smith et al. | 29/576 B |

OTHER PUBLICATIONS

Zeisse et al., Jour. Appl. Phys. 57 (1985) 1656.
J. M. Woodall et al., "Ohmic Contacts to n-GaAs using Graded Band Gap Layers of $Ga_{1-x}In_xAs$ Grown by Molecular Beam Epitaxy," J. Vac. Sci. Technol, 19(3), Sep./Oct. 1981, p. 626.
V. L. Rideout, "A Review of the Theory and Technology for Ohmic Contacts to Group III-V Compound Semiconductors, Solid State Electronics, 1975, vol. 18, pp. 541-550.
R. Stall et al., "Ultra Low Resistance Ohmic Contacts to n-GaAs", Electronic Letters, vol. 15, p. 800 (1979).

Primary Examiner—Upendra Roy
Attorney, Agent, or Firm—Robert M. Trepp; Bruce L. Lamb

[57] ABSTRACT

A method of forming a semiconductor device having a non-alloyed contact layer. An active region is formed in a substrate and the non-alloyed contact layer is formed in the active region, the barrier height of source and drain electrodes for the non-alloyed contact layer being lower than the barrier height of the source and drain electrodes for the active region or the substrate. The preferred method of forming the non-alloyed contact layer is high dose implantation of an element selected in accordance with the substrate material. For example, if the substrate is GaAs the non-alloyed contact layer is formed by implanting In, and if the substrate is InP the non-alloyed contact layer is formed by implanting As or Sb.

24 Claims, 10 Drawing Figures

METHOD OF FABRICATING SEMICONDUCTOR DEVICE HAVING LOW RESISTANCE NON-ALLOYED CONTACT LAYER

BACKGROUND OF THE INVENTION

1. Field of the Invention

The present invention relates to a method of fabricating a semiconductor device on a group III-V compound semiconductor substrate, and more particularly, to a method of fabricating a semiconductor device having a non-alloyed contact layer, in which the barrier height across the interface of an electrode and the non-alloyed contact layer is lower than the barrier height across the interface of an electrode and the group III-V compound semiconductor substrate, thereby providing low resistance ohmic contacts.

2. Description of the Related Art

In the fabrication of low noise, high gain microwave devices, solid state lasers, and LEDs with low power dissipation, it is necessary to form low resistance ohmic contacts. Difficulties have been encountered in forming low resistance ohmic contacts to gallium arsenide (GaAs), indium phosphide (InP), gallium aluminum arsenide (GaAlAs), and gallium phosphide (GaP) because of the relatively high barrier height across the interface of a metal electrode and these group III-V compound semiconductors.

The contact resistivity $\rho_c$ of a metal on a heavily doped semiconductor is given by the equation $$\rho_c = K\sqrt{\frac{m^*}{N}} \exp\left[K\phi_B\sqrt{\frac{m^*}{N}}\right] \quad (1)$$

wherein $\phi_B$ is the barrier height across the interface of the metal and the semiconductor, N is the carrier concentration, $m^*$ is the electron or hole (carrier) effective mass in the semiconductor, and K is a constant which is dependent on the dielectric constant, the electronic charge and Planck's constant. Theoretically, i.e., with regard to equation (1), low resistivity ohmic contacts can be obtained by increasing the carrier concentration N, decreasing the barrier height $\phi_B$, or by decreasing the charge carrier effective mass $m^*$. For a given semiconductor, however, only the barrier height $\phi_B$ and the carrier concentration N can be varied, and the maximum carrier concentrations for most group III-V compound semiconductors are generally less than $10^9 cm^{-3}$. Further, the barrier heights across the interface of different metals and group III-V semiconductors do not vary a great deal because of the pinning of the Fermi level. Thus, attempts to provide low resistivity ohmic contacts have been centered on increasing the carrier concentration N by unusual methods of achieving high doping, such as alloying gold-dopant alloys, or by lowering the barrier height $\phi_B$ across the interface of the metal and the semiconductor by epitaxially growing low band gap semiconductors. These two methods will be described below.

The alloying of metal-dopant alloys has been the most widely used method of obtaining low resistivity ohmic contacts. This method involves the heat treatment, or alloying, of a deposited gold-germanium (Au-Ge), gold-zinc (Au-Zn), or gold-berylium (Au-Be) alloy at temperatures higher than 360° C., and the reaction of Au with Ga in, for example, a GaAs substrate, during alloying provides carrier concentrations of as high as $5 \times 10^{19} cm^{-3}$ and contact resistivities as low as $10^{-6}$ $\Omega-cm^2$. This technique is discussed in an article entitled "A Review of the Theory and Technology for Ohmic Contacts to Group III-V Compound Semiconductors," by V. L. Rideout, Solid-State Electronics, Vol. 18, pp. 541-550 (1975).

The processing steps used to manufacture a semiconductor device having metal-dopant alloy ohmic contacts will be described with reference to FIGS. 1A-1C. As shown in FIG. 1A, a substrate 2 has an active region 4 formed therein by implanting silicon (Si), followed by annealing at approximately 850° C. for 15 minutes. Alternatively, the active region 4 may be epitaxially grown on the main surface of the substrate 2. Then, isolation regions (not shown) are formed so that each semiconductor device is formed on an electrically isolated portion of the substrate 2. A mask 6 having source and drain openings is formed on the active region 4, and an alloy, for example, AuGe, is deposited on a surface of the active region 4 through the source and drain openings in the mask 6 using a conventional lift-off technique. The deposited alloy is then heat treated, or alloyed, to form AuGe ohmic contacts 8 and 10, as shown in FIG. 1B. Following the alloying, a mask 12 having a gate opening is formed and a channel is etched in the active region 4. Thereafter, a gate electrode 14 is deposited through the gate opening in the mask 12 and the mask 12 is removed, as shown in FIG. 1C. Devices having metal-dopant alloys formed by this method have several disadvantages, such as, (1) a lack of control over the alloy depth, (2) the sensitivity of the quality of the contacts to surface cleaning before depositing electrodes, (3) difficulty in obtaining contact resistivities of less than $10^{-6}$ $\Omega-cm^2$, and (4) rough interfaces with the semiconductor device which give rise to non-uniform current flow.

A second technique for reducing the contact resistivity is to lower the barrier height by epitaxially growing low band gap semiconductors to form heteroepitaxial ohmic contacts. The epitaxial growth of low band gap semiconductors is usually performed by molecular beam epitaxial growth (MBE) or by metal organic vapor phase epitaxial growth (MOVPE) of a layer of a semiconductor which can be lattice matched to the substrate and which has a low barrier height across the metal semiconductor interfaces. Semiconductors used for this purpose have been Ge and InAs which have barrier heights lower than 0.5 eV, compared with GaAs which has a barrier height of 0.7-0.9 eV. In addition, the electron effective mass of $m^*=0.02m$ for InAs (where m is the mass of an electron in free space) is much lower than the electron effective mass of $m^*=0.068m$ for GaAs. Contact resistivities of less than $10^{-7}$ $\Omega-cm^2$ have been obtained by growing heavily doped layers of Ge (N ~ $10^{19}$ cm$^{-3}$) or heavily doped and compositionally graded layers of InGaAs on GaAs. The lowest contact resistivities ($10^{-8}$ $\Omega-cm^2$) have been achieved with metal/germanium/gallium arsenide ohmic contacts. Heteroepitaxial ohmic contacts are discussed in the following articles: "Ohmic Contacts to GaAs Using Graded Band Gap Layers of Ga$_{1-x}$In$_x$As Grown By Molecular Beam Epitaxy," by Woodall et al., Journal of Vacuum Science Technology, Vol. 19, No. 3, p. 624 (1981); and "Ultra Low Resistance Ohmic Contacts to n-GaAs," by Stall et al., Electronic Letters, Vol. 15, p. 800 (1979). The disadvantages of heteroepitaxial ohmic contacts are as follows: (1) they are not compatible with the planar technology necessary to fabricate microwave semiconductor devices; (2) they require expensive, complicated equipment to perform device processing steps which otherwise may not be performed; and (3) they require a lattice match with the substrate or epitaxial layer on which they are formed.

SUMMARY OF THE INVENTION

An object of the present invention is to provide a method of fabricating a semiconductor device having low resistance ohmic contacts.

A further object of the present invention is to provide a method of fabricating a semiconductor device having non-alloyed contact layers on a group III-V compound semiconductor substrate, in which the barrier height across the interface of an electrode and the non-alloyed contact layer is lower than the barrier height across the interface of an electrode and the group III-V substrate or an active region formed in or on the substrate.

A still further object of the present invention is to provide a method of fabricating a semiconductor device having low resistance ohmic contacts, which is compatible with the planar technology necessary to fabricate microwave and digital integrated circuits.

The present invention relates to a method of fabricating a semiconductor device including non-alloyed contact layers, wherein the barrier height across the interface of an electrode and a non-alloyed contact layer is lower than the barrier height across the interface of an electrode and an active region formed in the group III-V compound semiconductor on which the device is formed. The preferred manner of fabricating such non-alloyed contact layers is by high dose implantation of group III or group V element. This method is compatible with the planar technology necessary to fabricate microwave integrated circuits. Further, Group III-V compound semiconductors formed by high dose ion implantation have high electron affinities which are normally achieved only by epitaxial growth or other non-planar fabrication techniques. If a planar semiconductor device is not required the non-alloyed contact layers can be formed by epitaxial growth of a semiconductor having a lattice match with the substrate. The formation of a non-alloyed contact layer having a low barrier height $\phi_B$ across the interface with an electrode is more effective for reducing the contact resistivity $\rho_c$ than increasing the carrier concentration, since the contact resistivity $\rho_c$ varies as the square root of $1/N$, whereas the contact resistivity $\rho_c$ varies exponentially with $\phi_B$.

In a first embodiment of a method of fabricating a semiconductor device on a group III-V compound substrate according to the present invention, an active region is formed in the substrate and a gate electrode is formed on a selected portion of the active region. Then, a non-alloyed contact layer is formed in the active region using the gate electrode as a mask, and source and drain electrodes are formed on selected portions of the non-alloyed contact layer, the barrier height across the interface of the source and drain electrodes and the non-alloyed contact layer being lower than the barrier height across the interface of the source and drain electrodes and the group III-V compound substrate, and being lower than the barrier height across the interface of the source and drain electrodes and the active region.

In a second embodiment of a method of fabricating a semiconductor device on a group III-V compound substrate according to the present invention, an active region is formed in the substrate and a non-alloyed contact layer is formed in the active region. A selected portion of the non-alloyed contact layer is removed by etching to expose the active region and a gate electrode is formed on the exposed portion of the active region. Source and drain electrodes are formed on selected portions of the non-alloyed contact layer, the barrier height across the interface of the source and drain electrodes and the non-alloyed contact layer being lower than the barrier height across the interface of the source and drain electrodes and the group III-V compound substrate, and being lower than the barrier height across the interface of the source and drain electrodes and the active region.

In both the first and second embodiments of the present invention the active region and the non-alloyed contact layer may be formed by ion implantation or by epitaxial growth.

The methods of the first and second embodiments of the present invention have significant advantages over conventional methods of obtaining low resistance ohmic contacts, in that a semiconductor device having a non-alloyed contact layer fabricated in accordance with the present invention will have low resistance ohmic contacts, thereby providing low noise, high gain microwave semiconductor devices, solid state lasers, and high speed digital devices with low power dissipation on group III-V compound semiconductors such as GaAs, InP, GaAlAs, and GaP. The many features and advantages of the present invention will be apparent from the following detailed description taken in conjunction with the accompanying drawings in which like reference numerals refer to like elements.

DESCRIPTION OF THE PREFERRED EMBODIMENTS

Figure 1A:
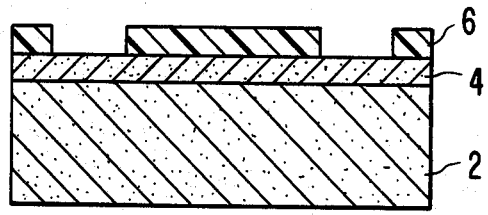
FIGS. 1A–1C are cross-sectional views showing the steps of fabricating MESFET devices having conventional metal-dopant alloy ohmic contacts.
Figure 1B:
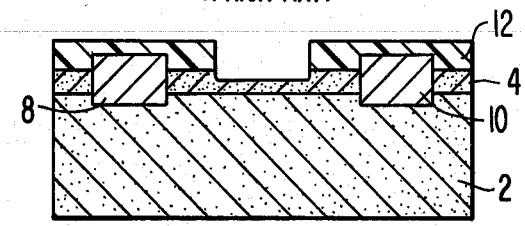
Figure 1C:
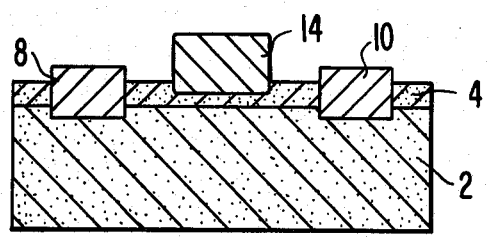
Figure 2A:
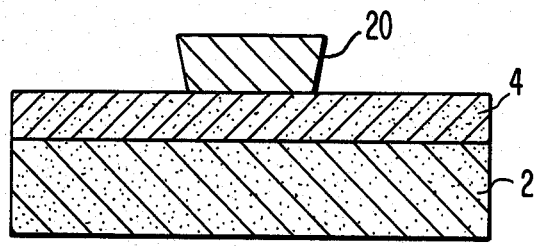
FIGS. 2A–2D are cross-sectional views showing various stages in the fabrication of a semiconductor device including a non-alloyed contact layer in accordance with a first embodiment of the present invention.

A fabrication process according to the first embodiment of the method of the present invention will be described with reference to FIGS. 2A–2D. As shown in FIG. 2A, a group III-V compound semiconductor substrate 2 has an active region 4 formed by known methods such as ion implantation or epitaxial growth implanting. After forming the active region 4, a gate electrode 20 is deposited on a surface of the active region 4. Angle reactive ion etching may be performed so that the gate electrode 20 has a trapezoidal cross-section with its narrower length at the surface of the active region 4, thereby preventing short-circuiting of the gate electrode 20 and subsequently formed source and drain regions 22a and 22b (FIG. 2B).

Figure 2B:
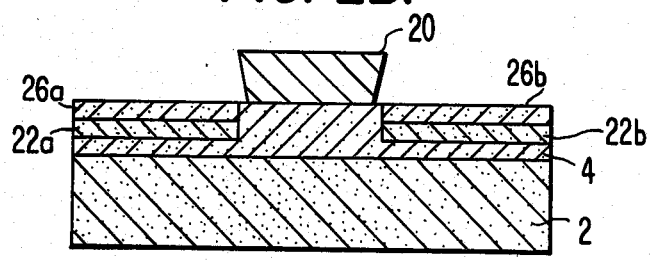

Referring to FIG. 2B, source and drain regions 22a and 22b are implanted in the active region 4 using the gate electrode 20 as a mask. The source and drain regions 22a and 22b are highly doped layers, or regions, formed by implanting dopant ions at high dosages. The dopant ions are selected in accordance with the composition of the substrate 2; for example, if the substrate 2 is semi-insulating GaAs, n-typed GaAs, GaAlAs, or n-type GaP, the dopant can be silicon (Si), implanted at energies of 25 to 100 keV and a dose of approximately $10^{14}$ cm$^{-2}$, or tin (Sn), implanted at energies of 90-200 keV with a dose of $10^{14}$ cm$^{-2}$. If the substrate is p-type InP or p-type GaP, the dopant can be beryllium (Be), implanted at energies of 10-50 keV with a dose of $10^{14}$ cm$^{-2}$, or zinc (Zn) implanted at energies of 60-120 keV with a dose of approximately $10^{14}$ cm$^{-2}$. The formation of the highly doped source and drain regions 22a and 22b is not essential; however, these regions provide improved operating characteristics. Non-alloyed contact layers 26a and 26b having a thickness up to 500Å, are formed in the source and drain regions 22a and 22b, respectively, by implanting ions selected in accordance with the composition of the substrate 2. Examples of the ions implanted to form the non-alloyed contact layers 26a and 26b are as follows: if the substrate 2 is formed of semi-insulating GaAs, n-type GaAs, or GaAlAs, indium (In) is implanted at energies up to 90 keV with a dose of approximately $10^{17}$ cm$^{-2}$; if the substrate 2 is p-type InP, arsenic (As) or antimony (Sb) is deposited at energies up to 60 keV with a dose of approximately $10^{17}$ cm$^{-2}$; and if the substrate is n-type or p-type GaP, In and As are implanted at energies of up to 90 keV and 60 keV, respectively, with dosages of $10^{17}$ cm$^{-2}$. Then, capless annealing is performed at 700°-900° C. for 15 to 30 minutes in an InAs atmosphere. The preferred annealing temperature and time are projected to be 850° C. and 15 minutes. Alternatively, an insulating layer of Si$_3$N$_4$ or SiO$_2$ can be formed over the surface of the device and annealing can be performed in any furnace with an N$_2$ or H$_2$ atmosphere. When annealing is completed, isolation regions (not shown) are formed to electrically isolate the several semiconductor devices which may be formed on the same supporting substrate 2. The isolation regions are formed in accordance with known processes, such as, implanting ions of iron (Fe) or oxygen (O$_2$), or by mesa etching.

Figure 2C:
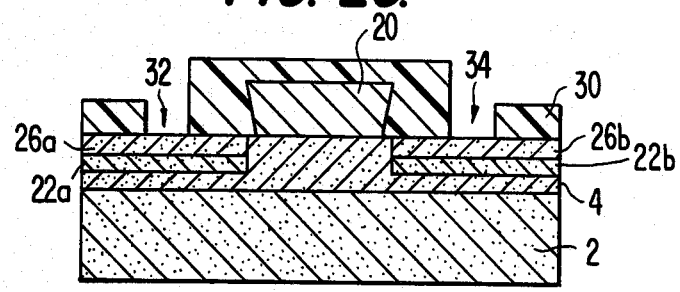
Figure 2D:
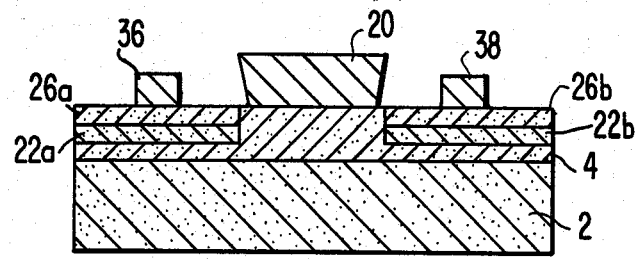

A mask 30, for example, a photoresist, shown in FIG. 2C, having source and drain electrode openings 32 and 34, is formed over the non-alloyed contact layers 26a and 26b and the gate 20 using a well known lift-off technique. Source and drain electrodes 36 and 38, shown in FIG. 2D, are deposited through the source and drain openings 32 and 34 in the mask 30 by conventional deposition methods, for example, electron beam evaporation or sputtering. The source and drain electrodes 36 and 38 are formed of metals such as gold (Au), tungsten (W), a gold-titanium alloy (AuTi), or a gold-germanium-nickel alloy (AuGeNi).

Figure 3A:
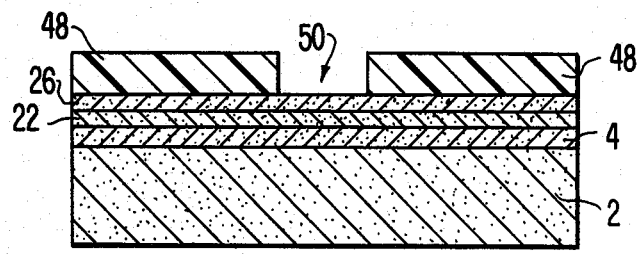
FIGS. 3A–3C are cross-sectional views showing various stages in the fabrication of a semiconductor device including a non-alloyed contact layer in accordance with a second embodiment of the present invention.

A method of fabricating a semiconductor device including a non-alloyed contact layer according to a second embodiment of the method of the present invention will be described with references to FIGS. 3A-3C. An active region 4, a source and drain layer, or region, 22 and a non-alloyed contact layer 26, as shown in FIG. 3A, are formed in the same manner described with respect to the first embodiment of the method of the present invention. After annealing the device under the same conditions described with respect to the first embodiment, isolation regions (not shown) are formed.

Then, a mask 48, for example, a photoresist, having a gate electrode opening 50 is formed using a well known lift-off technique.

Figure 3B:
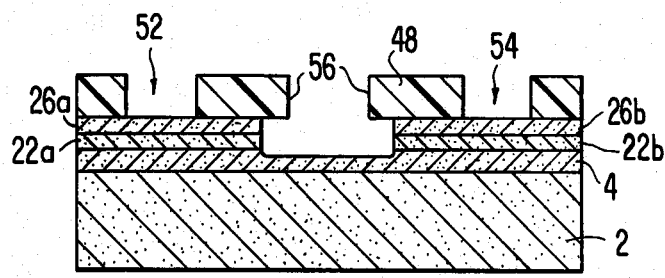
Figure 3C:
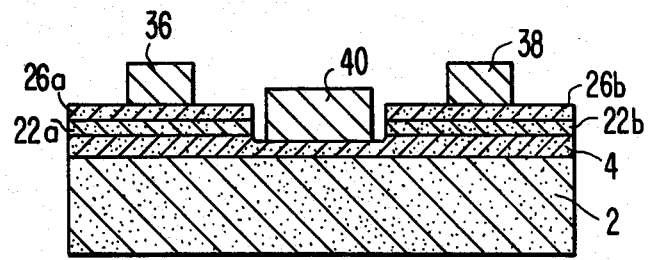

A channel, shown in FIG. 3B, is etched through the source and drain layer 22a and the non-alloyed contact layer 26a, using an etching time selected so that the etched channel extends approximately 100 Å into the active region 4. The etchant may comprise sulphuric acid, water, and hydrogen peroxide, in a ratio of 100:5:1, which yields an etching rate of approximately 100 ÅA/min. The etching process forms separate source and drain regions 22a and 22b and separate non-alloyed contact layers 26a and 26b. After etching is completed, source and drain openings 52 and 54 are formed in the mask 48 by exposing and removing portions of the mask. Then source and drain electrodes 36 and 38 and a gate electrode 40, shown in FIG. 3C, are deposited through the mask 48. Thereafter, the mask is removed. (Alternatively, the gate 40 may be deposited through the gate opening 50 and then covered with a photoresist (not shown) prior to forming the source and drain openings 52 and 54.) The source and drain electrodes 36 and 38 and the gate electrode 40 are formed of the same material, for example, tungsten (W) or any of the other materials disclosed with respect to the method of the first embodiment, and are deposited simultaneously. The etching process undercuts the mask 48, thereby forming lips 56, and thus the gate 40 is formed only on active region 4 and does not contact the source and drain regions 22a and 22b or the non-alloyed contact layers 26a and 26b.

Although the first and second embodiments described above relate to forming the active region 4 non-alloyed contact layers 26a and 26b by ion implantation, it is also possible to form the active region 4 and non-alloyed contact layer by epitaxial growth using a method similar to the method of the second embodiment of the present invention, if the non-alloyed contact layer formed by epitaxial growth has a lattice match with the group III-V compound semiconductor substrate.

Non-alloyed contact layers 26a and 26b formed in accordance with the first and second embodiments of the method of the present invention have a low enough contact resistivity so that annealing to form ohmic contacts with the source and drain electrodes is not necessary. However, the device may be annealed at 370°-450° C. to form ohmic contacts between the non-alloyed contact layers 26a and 26b and the source and drain electrodes 36 and 38, as well as to form an alloy of the electrode material and the non-alloyed contact layer material in the region where the electrode material diffuses into the non-alloyed contact layers 26a and 26b.

The embodiments of a method of fabricating a semiconductor device including a non-alloyed contact layer have many features and advantages which will be apparent to those skilled in the art from the detailed specification. Further, since numerous modifications and changes will readily occur to those skilled in the art, the claims are intended to cover all suitable modifications and equivalents falling within the true spirit and scope of the invention.

What is claimed is:

1. A method of fabricating a semicinductor device in a Group III-V compound substrate, comprising the steps of:

(a) forming an active region in the substrate;

(b) forming a gate electrode in a selected portion of said active region; and (c) using said gate electrode as a mask, implanting ions in selected portions of said active region to form non-alloyed source and drain contact layers, said ions implanted in said selected portions of said active region being selected from at least one element of the Groups III and V of the periodic table and selected in accordance with the composition of said substrate; and (d) forming source and drain electrodes by depositing on said source and drain contact layers, respectively, an electrode material selected from the group comprising gold, tungsten, gold-titanium alloys and gold-germanium-nickel alloys, the barrier height across the interfaces of said source and drain electrodes and said non-alloyed contact layer being lower than the barrier height across an interface of said source and drain electrodes and said active region.

2. A method according to claim 1 further comprising the step of annealing the semiconductor device at a temperature of at least 700° C. after step (c) and before step (d).

3. A method according to claim 1, wherein the non-alloyed contact layer has a contact resistivity of less than $10^{-7}$ $\Omega cm^2$.

4. A method according to claim 1, wherein the substrate comprises GaAs, and said step (c) comprises forming the non-alloyed contact layer by implanting In.

5. A method according to claim 1, wherein the substrate comprises InP, and said step (c) comprises forming the non-alloyed contact layer by implanting an element selected from the group consisting of As and Sb.

6. A method according to claim 1, wherein the substrate comprises GaAlAs, and said step (c) comprises forming the non-alloyed contact layer by implanting In.

7. A method according to claim 1, wherein the substrate comprises n-type GaP, and said step (c) comprises forming the non-alloyed contact layer by implanting In and As.

8. A method according to claim 1, wherein the substrate comprises p-type GaP, and said step (c) comprises forming the non-alloyed contact layer by implanting In and As.

9. A method according to claim 1, further comprising the step of implanting highly doped source and drain regions in the active region using the gate electrode as a mask after said step (b) and before said step (c), wherein the non-alloyed source and drain contact layers are formed in the source and drain regions.

10. A method according to claim 1, further comprising the step of reactive ion etching the gate electrode so that gate electrode has a trapezoidal cross-section with its narrower length at the surface of the active region step (b).

11. A method according to claim 2, wherein said annealing step comprises annealing at approximately 850° C. for approximately 15 minutes in an InAs atmosphere.

12. A method according to claim 2, wherein said annealing step comprises forming an insulating layer of a material selected from the group consisting of $Si_3N_4$ and $SiO_2$ on said non-alloyed source and drain contact layers and the gate electrode, and annealing at approximately 850° C. for approximately 15 minutes in an atmosphere selected from the group consisting of $N_2$ and $H_2$.

13. A method of fabricating a semiconductor device on a Group III-V semiconductor substrate having a predetermined composition, comprising the steps of:

(a) forming an active region in the substrate;

(b) forming a gate electrode on a selected portion of the active region;

(c) implanting ions to form source and drain regions in said active region and implanting ions to form non-alloyed contact layers in said source and drain regions using said gate electrode as a mask, said ions implanted to form said non-alloyed contact layers being selected from at least one element of Groups III and V of the periodic table in accordance with the composition of the substrate;

(d) annealing the semiconductor device at a temperature of at least 700° C.; and (e) forming source and drain electrodes by depositing on selected portions of the non-alloyed contact layers an electrode material selected from the group comprising gold, tungsten, gold-titanium alloys and gold-germanium-nickel alloys, the barrier height across an interface of the source and drain electrodes and the corresponding non-alloyed contact layers being lower than the barrier height across an interface of the source and drain electrodes and the active region.

14. A method of forming a semiconductor device on a Group III-V compound semiconductor substrate, comprising the steps of:

(a) forming an active region in the substrate and forming a non-alloyed contact layer in the active region;

(b) etching a selected portion of the non-alloyed contact layer to expose the active region; and (c) depositing an electrode material selected from the group comprising gold, tungsten, gold-titanium alloys and gold-germanium-nickel alloys to form a gate electrode on the exposed portion of the active region and to form source and drain electrodes on selected portions of the non-alloyed contact layer, the barrier height across the interfaces of the source and drain electrodes and the non-alloyed contact layer being lower than the barrier height across an interface of the source and drain electrodes and the active region.

15. A method according to claim 14, wherein said substrate has a predetermined composition, said step (a) comprises forming the non-alloyed contact layer in the active region by implanting at least one element selected in accordance with the composition of said substrate from the elements of Group III and V of the periodic table, so that the non-alloyed contact layer comprises a Group III-V compound semiconductor.

16. A method according to claim 1, wherein:

said step (a) comprises forming a highly doped layer in the active region, and forming the non-alloyed contact layer in the highly doped layer; and said step (b) comprises etching selected portions of the highly doped layer and the non-alloyed contact layer to expose a selected portion of the active region.

17. A method according to claim 14, wherein said step (a) comprises forming the non-alloyed contact layer by ion implantation, further comprising a step of annealing the semiconductor device at a temperature of at least 700° C. after said step (a) and before said step (b).

18. A method according to claim 16, wherein said step (a) comprises forming the highly doped layer by ion implantation, and forming the non-alloyed contact layer by ion implantation; further comprising the step of annealing the semiconductor device at a temperature of at least 700° C. after said step (a) and before said step (b).

19. A method according to claim 18, wherein the substrate comprises GaAs, and said step (a) comprises forming the highly doped layer by implanting an element selected from the group consisting of Si and Sn and forming the non-alloyed contact layer by implanting In.

20. A method according to claim 18, wherein the substrate comprises InP, and said step (a) comprises forming the highly doped layer by implanting an element selected from the group consisting of Be and Zn and forming the non-alloyed contact layer by implanting an element selected from the group consisting of As and Sb.

21. A method according to claim 18, wherein the substrate comprises GaAlAs, said step (a) comprises forming the highly doped layer by implanting an element selected from the group consisting of Si and Sn and forming the non-alloyed contact layer by implanting In and As.

22. A method according to claim 18, wherein the substrate comprises n-type GaP, said step (a) comprises forming the highly doped layer by implanting an element selected from the group consisting of Si and Sn and forming the non-alloyed contact layer by implanting In and As.

23. A method according to claim 18, wherein the substrate comprises p-type GaP, said step (a) comprises forming the highly doped layer by implanting an element selected from the group consisting of Be and Zn and forming the non-alloyed contact layer by implanting In and As.

24. A method according to claim 18, wherein said annealing step comprises annealing at approximately 850° C. for approximately 15 minutes in an InAs atmosphere.

* * * * *